United States Patent
Yamazaki

(10) Patent No.: US 9,496,416 B2
(45) Date of Patent: *Nov. 15, 2016

(54) SEMICONDUCTOR DEVICE AND METHOD FOR MANUFACTURING THE SAME

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/740,615

(22) Filed: Jun. 16, 2015

(65) Prior Publication Data
US 2015/0311352 A1 Oct. 29, 2015

Related U.S. Application Data

(63) Continuation of application No. 14/176,234, filed on Feb. 10, 2014, now Pat. No. 9,076,877, which is a
(Continued)

(30) Foreign Application Priority Data

Apr. 9, 2010 (JP) .................................. 2010-090368

(51) Int. Cl.
*H01L 29/78* (2006.01)
*H01L 21/00* (2006.01)
(Continued)

(52) U.S. Cl.
CPC ... *H01L 29/78696* (2013.01); *H01L 29/42384* (2013.01); *H01L 29/517* (2013.01); *H01L 29/7869* (2013.01); *H01L 29/78648* (2013.01)

(58) Field of Classification Search
CPC ................. H01L 29/24; H01L 29/7869; H01L 21/00; H01L 21/16; H01L 21/479
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 1770788 A 4/2007
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Monica D Harrison
(74) *Attorney, Agent, or Firm* — Fish & Richardson P.C.

(57) ABSTRACT

An object is to manufacture a semiconductor device with high reliability by providing the semiconductor device including an oxide semiconductor with stable electric characteristics. In a transistor including an oxide semiconductor layer, a gallium oxide film is used for a gate insulating layer and made in contact with an oxide semiconductor layer. Further, gallium oxide films are provided so as to sandwich the oxide semiconductor layer, whereby reliability is increased. Furthermore, the gate insulating layer may have a stacked structure of a gallium oxide film and a hafnium oxide film.

25 Claims, 9 Drawing Sheets

Related U.S. Application Data continuation of application No. 13/080,063, filed on Apr. 5, 2011, now Pat. No. 8,653,514.

(51) Int. Cl.
  *H01L 29/786* (2006.01)
  *H01L 29/423* (2006.01)
  *H01L 29/51* (2006.01)

(58) Field of Classification Search
  USPC .......................................................... 257/43
  See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 7,791,072 B2 | 9/2010 | Kumomi et al. |
| 7,994,500 B2 | 8/2011 | Kim et al. |
| 8,058,645 B2 | 11/2011 | Jeong et al. |
| 8,129,719 B2 | 3/2012 | Yamazaki et al. |
| 8,148,779 B2 | 4/2012 | Jeong et al. |
| 8,158,974 B2 | 4/2012 | Yano et al. |
| 8,188,480 B2 | 5/2012 | Itai |
| 8,203,143 B2 | 6/2012 | Imai |
| 8,203,144 B2 | 6/2012 | Hoffman et al. |
| 8,343,817 B2 | 1/2013 | Miyairi et al. |
| 8,368,066 B2 | 2/2013 | Yamazaki et al. |
| 8,502,221 B2 | 8/2013 | Yamazaki |
| 8,513,661 B2 | 8/2013 | Takahashi et al. |
| 8,518,761 B2 | 8/2013 | Yamazaki et al. |
| 8,647,031 B2 | 2/2014 | Hoffman et al. |
| 8,653,514 B2 | 2/2014 | Yamazaki |
| 8,659,013 B2 | 2/2014 | Yamazaki |
| 8,729,547 B2 | 5/2014 | Miyairi et al. |
| 8,779,419 B2 | 7/2014 | Yano et al. |
| 8,884,282 B2 | 11/2014 | Yamazaki |
| 9,006,046 B2 | 4/2015 | Yamazaki et al. |
| 9,059,047 B2 | 6/2015 | Yamazaki |
| 9,059,295 B2 | 6/2015 | Yamazaki |
| 9,076,877 B2 * | 7/2015 | Yamazaki ........................ 257/43 |
| 9,147,768 B2 | 9/2015 | Yamazaki |
| 9,190,522 B2 | 11/2015 | Yamazaki |
| 9,196,739 B2 | 11/2015 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0206979 A1 | 10/2004 | Braddock |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0044714 A1 | 3/2007 | White |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308806 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0236655 A1 | 9/2009 | Choi et al. |
| 2009/0278120 A1 | 11/2009 | Lee et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2009/0321732 A1 | 12/2009 | Kim et al. |
| 2010/0032668 A1 | 2/2010 | Yamazaki et al. |
| 2010/0038641 A1 | 2/2010 | Imai |
| 2010/0051937 A1 | 3/2010 | Kaji et al. |
| 2010/0065837 A1 | 3/2010 | Omura et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0200843 A1 | 8/2010 | Arai et al. |
| 2010/0264412 A1 | 10/2010 | Yamazaki et al. |
| 2010/0295041 A1 | 11/2010 | Kumomi et al. |
| 2011/0193083 A1 | 8/2011 | Kim et al. |
| 2011/0240990 A1 | 10/2011 | Yamazaki |

(56) References Cited

U.S. PATENT DOCUMENTS

| | | |
|---|---|---|
| 2011/0240991 A1 | 10/2011 | Yamazaki |
| 2011/0240992 A1 | 10/2011 | Yamazaki |
| 2011/0240993 A1 | 10/2011 | Yamazaki |
| 2011/0240994 A1 | 10/2011 | Yamazaki |
| 2011/0240995 A1 | 10/2011 | Yamazaki |
| 2011/0248260 A1 | 10/2011 | Yamazaki |
| 2012/0119205 A1 | 5/2012 | Taniguchi et al. |
| 2014/0231800 A1 | 8/2014 | Miyairi et al. |

FOREIGN PATENT DOCUMENTS

| | | |
|---|---|---|
| EP | 2141743 A | 1/2010 |
| EP | 2141744 A | 1/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 05-251705 A | 9/1993 |
| JP | 08-264794 A | 10/1996 |
| JP | 63-265818 A | 11/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-073698 A | 3/2007 |
| JP | 2007-096055 A | 4/2007 |
| JP | 2007-123861 A | 5/2007 |
| JP | 2007-529119 | 10/2007 |
| JP | 2008-218495 A | 9/2008 |
| JP | 2009-176865 A | 8/2009 |
| JP | 2009-231613 A | 10/2009 |
| JP | 2009-283554 A | 12/2009 |
| JP | 2010-062549 A | 3/2010 |
| JP | 2010-067954 A | 3/2010 |
| WO | WO-2004/114391 | 12/2004 |
| WO | WO-2005/093850 | 10/2005 |
| WO | WO-2008/105250 | 9/2008 |
| WO | WO-2008/117739 | 10/2008 |
| WO | WO-2009/093722 | 7/2009 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn—Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg—Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No, 2317, ECS.

Kimizuka.N et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M, "Synthesis of Homologous Compound with New Long-Period Structure", NIRIM Newsletter, Mar. 1, 1995, vol. 150, pp. 1-4.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4,0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m>4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review, B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009 pp. 184-187.
Osada.T et al., "Development of Driver-Integrated Panel using Amorphous In—Ga—Zn—Oxide TFT", AM-FPD '09 Digest of Technical Papers, Jul. 1, 2009, pp. 33-36.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No, 25, pp. 3650-3652.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

SEMICONDUCTOR DEVICE AND METHOD FOR MANUFACTURING THE SAME

CROSS-REFERENCE TO RELATED APPLICATIONS

This application is a continuation of U.S. application Ser. No. 14/176,234, filed Feb. 10, 2014, now allowed, which is a continuation of U.S. application Ser. No. 13/080,063, filed Apr. 5, 2011, now U.S. Pat. No. 8,653,514, which claims the benefit of a foreign priority application filed in Japan as Serial No. 2010-090368 on Apr. 9, 2010, all of which are incorporated by reference.

BACKGROUND OF THE INVENTION

1. Field of the Invention

The present invention relates to a semiconductor device including an oxide semiconductor and a manufacturing method thereof.

In this specification, a semiconductor device generally means a device which can function by utilizing semiconductor characteristics, and an electro-optical device, a semiconductor circuit, and an electronic device are all semiconductor devices.

2. Description of the Related Art

In recent years, a technique for forming a thin film transistor (TFT) by using a thin semiconductor film (having a thickness of approximately several nanometers to several hundred nanometers) formed over a substrate having an insulating surface has attracted attention. Thin film transistors are applied to a wide range of electronic devices such as ICs or electro-optical devices, and prompt development of thin film transistors that are to be used as switching elements in image display devices, in particular, is being pushed. Various metal oxides are used for a variety of applications.

Some metal oxides have semiconductor characteristics. The examples of such metal oxides having semiconductor characteristics are a tungsten oxide, a tin oxide, an indium oxide, a zinc oxide, and the like. A thin film transistor in which a channel formation region is formed using such metal oxides having semiconductor characteristics is known (Patent Documents 1 and 2).

REFERENCE

Patent Documents

[Patent Document 1] Japanese Published Patent Application No. 2007-123861
[Patent Document 2] Japanese Published Patent Application No. 2007-096055

SUMMARY OF THE INVENTION

However, in a thin film formation process, when the composition of an oxide semiconductor differs from the stoichiometric composition because of an excess or a deficiency of oxygen or the like, or hydrogen or moisture which serves as an electron donor enters the oxide semiconductor, the conductivity of the oxide semiconductor is changed. Such a phenomenon becomes a factor of variation in the electric characteristics of a transistor including the oxide semiconductor.

Further, when the energy gap of a material of an insulating layer in contact with an oxide semiconductor layer is sufficiently wide as compared to the energy gap of a material of the oxide semiconductor layer, charge is easily stored at the interface between the oxide semiconductor layer and the insulating layer.

For example, when the energy gap of the material of the insulating layer is sufficiently wide as compared to the energy gap of the material of the oxide semiconductor layer, charge is stored at the back channel side of the oxide semiconductor layer, so that a parasitic channel might be generated. When the parasitic channel is generated, variation in threshold value or the like occurs, which might result in the reduction of reliability.

In view of the above problems, one object is to provide a semiconductor device including an oxide semiconductor layer, which has stable electric characteristics and high reliability.

An embodiment of the present invention disclosed in this specification is a semiconductor device including a gate electrode, a gate insulating layer formed using a metal oxide film, an oxide semiconductor layer which is in contact with the gate insulating layer and overlaps with the gate electrode, and a source electrode and a drain electrode which are in contact with the oxide semiconductor layer. An insulating material containing a gallium element is used for the gate insulating layer formed using a metal oxide film. Specifically, a gallium oxide film with a thickness greater than or equal to 3 nm and less than or equal to 300 nm is used.

In the case where an integrated circuit into which a transistor is incorporated is mounted on an electronic device, for example, a drive voltage of 5 V to 10 V is used in a pixel portion of a liquid crystal panel, depending on the mode of liquid crystals to be used. Thus, the transistor provided in the pixel portion desirably has a structure suitable for operation at a drive voltage of 5 V to 10 V. Therefore, when an insulating layer containing a gallium element is used as a gate insulating layer in a liquid crystal panel, the insulating layer containing a gallium element is preferably formed to a thickness greater than or equal to 50 nm and less than or equal to 500 nm, preferably greater than or equal to 60 nm and less than or equal to 300 nm.

The gate insulating layer containing a gallium element is not used just for a liquid crystal display device. In the case where a transistor including the gate insulating layer containing a gallium element is mounted on an LSI, the transistor needs to operate at high speed. Therefore, the gate insulating layer containing a gallium element is formed to a thickness greater than or equal to 3 nm and less than or equal to 50 nm, preferably greater than or equal to 5 nm and less than or equal to 20 nm. In the case of being used for a transistor with high withstand voltage, such as a power device, the gate insulating layer containing a gallium element is formed to a thickness greater than or equal to 50 nm and less than or equal to 500 nm, preferably greater than or equal to 100 nm and less than or equal to 300 nm.

The gate insulating layer may have a stacked structure; in that case, the stacked structure may include an insulating layer containing hafnium. In the case of the stacked structure, the insulating layer containing a gallium element is used as a layer in contact with the oxide semiconductor layer. The insulating layer containing a gallium element is formed to a thickness greater than or equal to 3 nm and less than or equal to 30 nm, preferably greater than or equal to 3 nm and less than or equal to 10 nm. Further, in the case of the stacked structure, the insulating layer containing hafnium is formed to a thickness greater than or equal to 3 nm and less than or equal to 100 nm, preferably greater than or equal to 10 nm and less than or equal to 20 nm.

Note that, in a thin film formation process, when the composition of an oxide semiconductor layer differs from the stoichiometric composition because of an excess or a deficiency of oxygen or the like, or hydrogen or moisture which serves as an electron donor enters the oxide semiconductor layer, the conductivity of the oxide semiconductor layer is changed. Such a phenomenon becomes a factor of variation in the electric characteristics of a transistor including an oxide semiconductor. Therefore, an oxide semiconductor layer is highly purified to be electrically i-type (intrinsic) by intentionally removing impurities such as hydrogen, moisture, a hydroxyl group, and hydride (also referred to as a hydrogen compound) from the oxide semiconductor and supplying oxygen which is a major constituent of the oxide semiconductor and is simultaneously reduced in a step of removing impurities.

Further, not only from the oxide semiconductor layer but also from the gate insulating layer, impurities such as hydrogen, moisture, a hydroxyl group, and hydride (also referred to as a hydrogen compound) are intentionally removed, whereby a gate insulating layer formed using gallium oxide is highly purified.

The electric characteristics of a transistor including a highly-purified oxide semiconductor layer and a highly-purified gate insulating layer, such as the threshold voltage and on-state current, have little temperature dependence. Further, transistor characteristics hardly change due to light deterioration.

An oxide semiconductor layer of a thin film transistor may be sandwiched between insulating layers containing a gallium element. A semiconductor device having such a structure includes a gate electrode; a gate insulating layer formed using a first metal oxide film; an oxide semiconductor layer which is in contact with the gate insulating layer and overlaps with the gate electrode; a second metal oxide film which is in contact with the oxide semiconductor layer; and a source electrode and a drain electrode which are in contact with the oxide semiconductor layer.

For example, in the case of a bottom-gate transistor, an insulating layer containing a gallium element is used as a gate insulating layer. In this case, if another insulating layer containing a gallium element is provided over an oxide semiconductor layer, the insulating layer containing a gallium element is used as an insulating layer which is on and in contact with the oxide semiconductor layer. That is, an oxide semiconductor layer is sandwiched between insulating layers containing a gallium element.

In the case of a top-gate transistor, an insulating layer containing a gallium element is used as a gate insulating layer. In this case, if another insulating layer containing a gallium element is provided under an oxide semiconductor layer, the insulating layer containing a gallium element is used as a base insulating layer in contact with a substrate. That is, an oxide semiconductor layer is sandwiched between insulating layers containing a gallium element. A semiconductor device having such a structure includes a first metal oxide film over a substrate; a source electrode and a drain electrode over the first metal oxide film; an oxide semiconductor layer over the first metal oxide film, the source electrode, and the drain electrode; a gate insulating layer formed using a second metal oxide film, over the oxide semiconductor layer; and a gate electrode which overlaps with the oxide semiconductor layer with the gate insulating layer interposed therebetween. In the semiconductor device, the first metal oxide film and the second metal oxide film are gallium oxide films.

In the case of a dual-gate transistor, an oxide semiconductor layer is sandwiched between a first gate insulating layer containing a gallium element and a second gate insulating layer containing a gallium element. A semiconductor device having such a structure includes a first gate electrode over a substrate; a first gate insulating layer formed using a first metal oxide film, over the first gate electrode; an oxide semiconductor layer which overlaps with the first gate electrode, over the first gate insulating layer; a source electrode and a drain electrode which are on and in contact with the oxide semiconductor layer; a second gate insulating layer formed using a second metal oxide film, over the oxide semiconductor layer, the source electrode, and the drain electrode; and a second gate electrode over the second gate insulating layer. In the semiconductor device, the first metal oxide film and the second metal oxide film are gallium oxide films. In the case of a dual-gate transistor, the oxide semiconductor layer is sandwiched between the first gate electrode and the second gate electrode. With such a structure, entry of light from the outside can be efficiently blocked. Thus, variation in the electric characteristics of the transistor due to light irradiation performed on the oxide semiconductor layer can be suppressed.

In each of the aforementioned structures, the channel length L of the transistor, which is determined by the distance between the source electrode and the drain electrode of the transistor, can be greater than or equal to 10 nm and less than or equal to 10 μm, for example, 0.1 μm to 0.5 μm. It is needless to say that the channel length L may be greater than or equal to 1 μm. The channel width W may be greater than or equal to 10 nm.

According to one embodiment of the present invention, a transistor having stable electric characteristics is provided.

According to one embodiment of the present invention, a semiconductor device including a highly reliable transistor having favorable electric characteristics is provided.

DETAILED DESCRIPTION OF THE INVENTION

Embodiments of the present invention will be described in detail below with reference to drawings. However, the present invention is not limited to the description below, and it is easily understood by those skilled in the art that modes and details disclosed herein can be modified in various ways.

Therefore, the present invention is not construed as being limited to description of the embodiments below.

Embodiment 1

In this embodiment, an example of a transistor that can be applied to a semiconductor device disclosed in this specification will be described. There is no particular limitation on a structure of the transistor that can be applied to the semiconductor device disclosed in this specification. For example, a staggered transistor, a planar transistor, or the like having a top-gate structure in which a gate electrode is provided above an oxide semiconductor layer with a gate insulating layer interposed therebetween or a bottom-gate structure in which a gate electrode is provided below an oxide semiconductor layer with a gate insulating layer interposed therebetween, can be used. Further, the transistor may have a single gate structure including one channel formation region, a double gate structure including two channel formation regions, or a triple gate structure including three channel formation regions. Alternatively, the transistor may have a dual-gate structure having two gate electrodes, one of which is provided above a channel region with a gate insulating layer interposed therebetween and the other of which is provided below the channel formation region with another gate insulating layer interposed therebetween.

FIGS. 1A to 1D show examples of the cross-sectional structure of a transistor. Each of the transistors illustrated in FIGS. 1A to 1D includes an oxide semiconductor as a semiconductor. An advantage of using an oxide semiconductor is that the maximum value of field-effect mobility (greater than or equal to 5 $cm^2$/Vsec, preferably greater than or equal to 10 $cm^2$/Vsec and less than or equal to 150 $cm^2$/Vsec) is relatively high when a transistor is on.

Figure 1A:
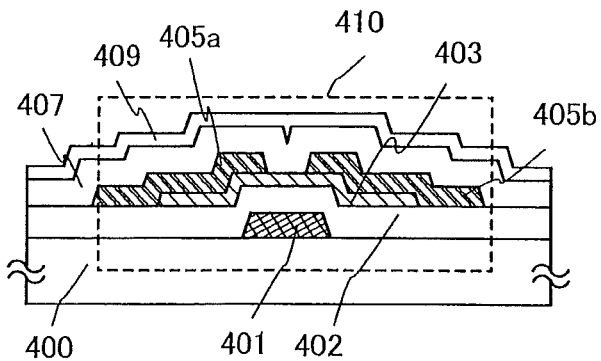
FIGS. 1A to 1D are cross-sectional views illustrating one embodiment of the present invention.

A transistor 410 illustrated in FIG. 1A is an example of a bottom-gate transistor, and is also referred to as an inverted-staggered transistor.

The transistor 410 includes, over a substrate 400 having an insulating surface, a gate electrode 401, a gate insulating layer 402 formed using a gallium oxide film, an oxide semiconductor layer 403, a source electrode 405a, and a drain electrode 405b. Further, an insulating film 407 which covers the transistor 410 and is in contact with the oxide semiconductor layer 403 is provided. Further, a protective insulating layer 409 is formed over the insulating film 407.

The gallium oxide film used for the gate insulating layer 402 is also expressed by $GaO_x$ (x>0), and the value of x is preferably set so that the proportion of oxygen in the gallium oxide film is higher than the stoichiometric proportion of oxygen in a gallium oxide film. For example, the value of x is preferably set greater than or equal to 1.4 and less than or equal to 2.0, more preferably greater than or equal to 1.5 and less than or equal to 1.8. Note that an impurity element other than hydrogen, e.g., a Group 3 element such as yttrium; a Group 4 element such as hafnium; a Group 13 element such as aluminum; a Group 14 element such as silicon; nitrogen; or the like may be contained in the gallium oxide film, so that the energy gap of gallium oxide is widened and the insulating property can thus be improved. The energy gap of a gallium oxide film which does not contain impurity is 4.9 eV; however, when the gallium oxide film which does not contain impurity contains the aforementioned impurity that accounts for approximately more than 0 atomic % and less than or equal to 20 atomic % for example, the energy gap of the gallium oxide film can be widened to about 6 eV.

Figure 1B:
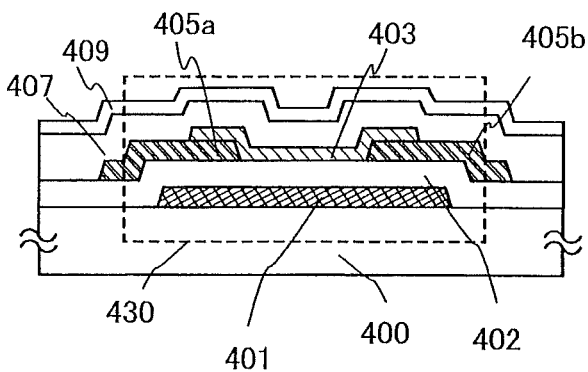

A transistor 430 illustrated in FIG. 1B is a bottom-gate transistor and includes, over a substrate 400 having an insulating surface, a gate electrode 401, a gate insulating layer 402 formed using a gallium oxide film, a source electrode 405a, a drain electrode 405b, and an oxide semiconductor layer 403. An insulating film 407 which covers the transistor 430 and is in contact with the oxide semiconductor layer 403 is provided. Further, a protective insulating layer 409 is formed over the insulating film 407.

In the transistor 430, the gate insulating layer 402 is provided on and in contact with the substrate 400 and the gate electrode 401, and the source electrode 405a and the drain electrode 405b are provided on and in contact with the gate insulating layer 402. Further, the oxide semiconductor layer 403 is provided over the gate insulating layer 402, the source electrode 405a, and the drain electrode 405b.

Figure 1C:
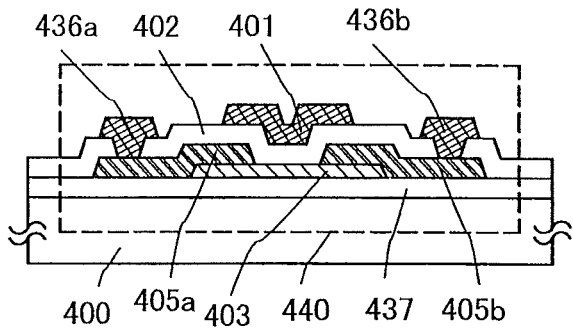

A transistor 440 illustrated in FIG. 1C is an example of a top-gate transistor. The transistor 440 includes, over a substrate 400 having an insulating surface, an insulating film 437, an oxide semiconductor layer 403, a source electrode 405a, a drain electrode 405b, a gate insulating layer 402 formed using a gallium oxide film, and a gate electrode 401. A wiring layer 436a and a wiring layer 436b are provided in contact with and are electrically connected to the source electrode 405a and the drain electrode 405b, respectively.

Figure 1D:
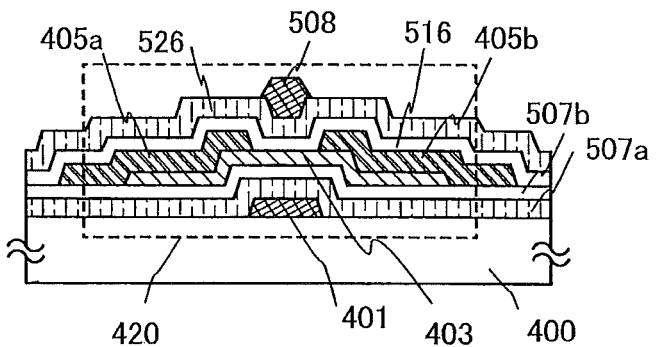

A transistor 420 illustrated in FIG. 1D is an example of a dual-gate transistor. The transistor 420 includes, over a substrate 400 having an insulating surface, a gate electrode 401, a first gate insulating layer 507a formed using a hafnium oxide film (relative dielectric constant ∈=15), a second gate insulating layer 507b formed using a gallium oxide film (relative dielectric constant ∈=10.2), an oxide semiconductor layer 403, a source electrode 405a, and a drain electrode 405b. A first insulating film 516 including gallium oxide, which covers the transistor 420 and is in contact with the oxide semiconductor layer 403, is provided. A second insulating film 526 formed using a hafnium oxide film is formed over the first insulating film 516.

When an oxide semiconductor layer is used for a semiconductor layer including a channel formation region in a transistor, the threshold voltage of the transistor sometimes shifts in the positive or negative direction depending on a manufacturing process of a semiconductor device. Therefore, the transistor in which an oxide semiconductor is used for a semiconductor layer including a channel formation region is preferably, like the transistor 420, a dual-gate transistor in which a second gate electrode 508 is provided over the second insulating film 526 so that the threshold voltage can be controlled. The potential of the gate electrode 401 or the potential of the second gate electrode 508 is controlled, whereby the threshold voltage can be made to be a desired level. Further, the gate electrode 401 and the second gate electrode 508 can block light irradiation from the outside; thus, variation in the electric characteristics of the transistor due to light irradiation performed on the oxide semiconductor layer 403 can be suppressed.

Further, in the transistors 410, 420, 430, and 440 each including the oxide semiconductor layer 403, relatively high field-effect mobility can be obtained, whereby high-speed operation is possible.

As a material used for the oxide semiconductor layer 403, an In—Sn—Ga—Zn—O-based oxide semiconductor which is a quaternary metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—

Al—Zn—O-based oxide semiconductor which is a ternary metal oxide; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Ga—O-based oxide semiconductor, or an In—Mg—O-based oxide semiconductor which is a binary metal oxide; or an In—O-based oxide semiconductor, a Sn—O-based oxide semiconductor, or a Zn—O-based oxide semiconductor can be used. Further, $SiO_2$ may be contained in the above oxide semiconductor. In this specification, for example, an In—Ga—Zn—O-based oxide semiconductor means an oxide film containing indium (In), gallium (Ga), and zinc (Zn), and there is no particular limitation on the composition ratio. The In—Ga—Zn—O-based oxide semiconductor may contain an element other than In, Ga, and Zn.

For the oxide semiconductor layer, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 ($In_2O_3$:ZnO=15:2 to 3:4 in a molar ratio). For example, when a target used for forming the In—Zn—O-based oxide semiconductor has a composition ratio of In:Zn:O=X:Y:Z in an atomic ratio, Z>(1.5X+Y).

Although there is no particular limitation on a substrate that can be used as the substrate 400 having an insulating surface, a glass substrate made of barium borosilicate glass, aluminoborosilicate glass, or the like can be used.

The gate electrode 401, the wiring layer 436a, the wiring layer 436b, and the second gate electrode 508 can be formed to have a single-layer structure or a stacked structure using a metal material such as Mo, Ti, Cr, Ta, W, Al, Cu, Nd or Sc, or an alloy material containing the above metal material as its main component.

As a conductive film used for the source electrode 405a and the drain electrode 405b, for example, a metal film containing an element selected from Al, Cr, Cu, Ta, Ti, Mo, and W or a metal nitride film containing any of the above elements as its main component (a titanium nitride film, a molybdenum nitride film, or a tungsten nitride film) can be used. Alternatively, a film of a high-melting-point metal such as Ti, Mo, or W or a metal nitride film of any of these elements (e.g., a titanium nitride film, a molybdenum nitride film, or a tungsten nitride film) may be stacked on one of or both a bottom side and a top side of a metal film of Al, Cu, or the like.

As the insulating film 407 and the first insulating film 516 which are provided on and in contact with the oxide semiconductor layer, an inorganic insulating film such as a gallium oxide film, a silicon oxide film, a silicon oxynitride film, an aluminum oxide film, or an aluminum oxynitride film can be typically used. As the insulating film 437, the gate insulating layer 402, and the second gate insulating layer 507b which are provided under and in contact with the oxide semiconductor layer, an inorganic insulating film such as a gallium oxide film, a silicon oxide film, a silicon oxynitride film, an aluminum oxide film, or an aluminum oxynitride film can be typically used.

As the protective insulating layer 409 and the second insulating film 526 which are provided over the oxide semiconductor layer, a silicon oxide film, a silicon oxynitride film, a silicon nitride film, an aluminum nitride film, an aluminum oxynitride film, a high-k film containing hafnium, or the like can be used. As the high-k film containing hafnium, for example, a hafnium oxide film, a hafnium silicate film, a hafnium oxynitride silicate film, or a hafnium aluminate film can be used.

<Manufacturing Process of Transistor 410>

An example of a manufacturing process of the transistor 410 illustrated in FIG. 1A is described with reference to FIGS. 2A to 2E.

First, the gate electrode 401 is formed over the substrate 400.

Although there is no particular limitation on a material and the like of the substrate 400, it is necessary that the substrate have such heat resistance that it can withstand at least a heat treatment performed later. For example, a glass substrate, a ceramic substrate, a quartz substrate, a sapphire substrate, or the like can be used as the substrate 400. Alternatively, a single crystal semiconductor substrate or a polycrystalline semiconductor substrate of silicon, carbon silicon, or the like; a compound semiconductor substrate of silicon germanium or the like; an SOI substrate, or the like can be used. A substrate over which a semiconductor element is provided may be used as the substrate 400.

Further, a flexible substrate may be used as the substrate 400. In the case where a transistor is provided over a flexible substrate, either of the following methods is employed: a method in which a transistor is directly formed over a flexible substrate; and a method in which a transistor is formed over a substrate other than a flexible substrate and then separated from the substrate and transferred onto a flexible substrate. When the transistor is separated from the substrate and transferred onto the flexible substrate, a separation layer may be formed between the substrate and the transistor.

Then, the gate insulating layer 402 covering the gate electrode 401 is formed.

The gate insulating layer 402 is formed by a sputtering method or the like using a target of gallium oxide. The gate insulating layer 402 is desirably formed by a method in which hydrogen, water, or the like does not easily enter the gate insulating layer 402. The gate insulating layer 402 is formed to a thickness greater than or equal to 50 nm and less than or equal to 500 nm, preferably greater than or equal to 60 nm and less than or equal to 300 nm.

Figure 2A:
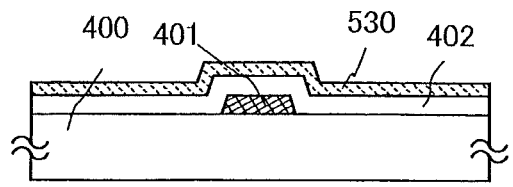
FIGS. 2A to 2E are cross-sectional process views illustrating one embodiment of the present invention.

Then, the oxide semiconductor film 530 is formed on and in contact with the gate insulating layer 402 (see FIG. 2A). In this embodiment, the oxide semiconductor film is formed by a sputtering method using an In—Ga—Zn—O-based oxide target. As the In—Ga—Zn—O-based oxide target, for example, an oxide target having a composition ratio of $In_2O_3:Ga_2O_3:ZnO=1:1:1$ [molar ratio] can be used. Note that the material and the composition of the target are not necessarily limited to the above. For example, an oxide target having a composition ratio of $In_2O_3:Ga_2O_3:ZnO=1:1:2$ [molar ratio] can be used. The filling rate of the oxide target is greater than or equal to 90% and less than or equal to 100%, preferably greater than or equal to 95% and less than or equal to 99.9%. This is because, with the use of a metal oxide target with a high filling rate, a dense oxide semiconductor film can be formed.

The oxide semiconductor film 530 is desirably formed by a method in which hydrogen, water, or the like does not easily enter the oxide semiconductor film 530. An atmosphere for the film formation may be a rare gas (typically argon) atmosphere, an oxygen atmosphere, a mixed atmosphere of a rare gas and oxygen, or the like. Further, in order to prevent hydrogen, water, a hydroxyl group, hydride, and the like from entering the oxide semiconductor film, it is desirable to use an atmosphere of a high-purity gas from which impurities such as hydrogen, water, a hydroxyl group, and hydride are sufficiently removed. For example, the oxide semiconductor film can be formed by a sputtering method or the like. Further, the oxide semiconductor film is desirably formed to a thickness greater than or equal to 3 nm and less than or equal to 30 nm because when the thickness of the oxide semiconductor film is too large (for example, when the thickness is greater than or equal to 50 nm), the transistor might be normally on. It is preferable that the gate insulating layer 402 and the oxide semiconductor film 530 be successively formed without being exposed to the air.

For example, when the oxide semiconductor film is formed in the following manner, hydrogen, water, a hydroxyl group, hydride, and the like can be prevented from entering the oxide semiconductor film.

First, the substrate 400 is placed in a deposition chamber kept under reduced pressure, and the substrate temperature is set to higher than or equal to 100° C. and lower than or equal to 600° C., preferably higher than or equal to 200° C. and lower than or equal to 400° C. This is because the concentration of an impurity contained in the oxide semiconductor film can be reduced when deposition is performed while the substrate 400 is heated. This is also because damage to the oxide semiconductor film due to sputtering can be reduced.

Then, a high-purity gas from which impurities such as hydrogen and moisture are sufficiently removed is introduced into the deposition chamber from which remaining moisture is being removed, and the oxide semiconductor film is formed over the substrate 400 with the use of the target. In order to remove moisture remaining in the deposition chamber, an entrapment vacuum pump such as a cryopump, an ion pump, or a titanium sublimation pump is desirably used as an evacuation unit. Further, the evacuation unit may be a turbo pump provided with a cold trap. In the deposition chamber which is evacuated with the cryopump, a hydrogen molecule, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced.

An example of the deposition condition is as follows: the distance between the substrate and the target is 100 mm, the pressure is 0.6 Pa, the direct-current (DC) power is 0.5 kW, and the deposition atmosphere is an oxygen atmosphere (the flow rate of the oxygen is 100%). Note that a pulse direct current power source is preferable because powdery substances (also referred to as particles or dust) generated in deposition can be reduced and film thickness distribution becomes uniform.

Then, the oxide semiconductor film is processed. The oxide semiconductor film is processed by being etched after a mask having a desired shape is formed over the oxide semiconductor film. The mask may be formed by a method such as photolithography or an ink-jet method. In this embodiment, an In—Ga—Zn—O film is used as the oxide semiconductor film, and a $GaO_x$ film is used as the gate insulating layer. Since both the In—Ga—Zn—O film and the $GaO_x$ film contain Ga, a region of the gate insulating layer which is not covered with the mask is thinned at the time of processing the oxide semiconductor film. Note that for simplicity, a scene where the thickness of the gate insulating layer varies from region to region is not shown in FIG. 2B.

For the etching of the oxide semiconductor film, either wet etching or dry etching may be employed. It is needless to say that both of them may be employed in combination.

Figure 2B:
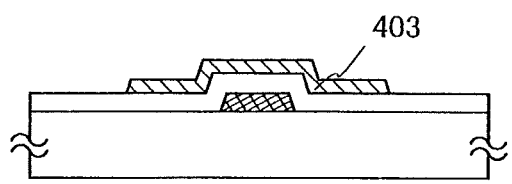

After that, heat treatment (first heat treatment) is desirably performed on the oxide semiconductor layer. Excessive hydrogen (including water and a hydroxyl group) in the oxide semiconductor film is removed by the first heat treatment and the structure of the oxide semiconductor layer is modified, so that defect levels in an energy gap can be reduced. A cross-sectional view of the steps so far is shown in FIG. 2B. The first heat treatment is performed at a temperature higher than or equal to 250° C. and lower than or equal to 650° C., preferably higher than or equal to 450° C. and lower than or equal to 600° C. or lower than the strain point of the substrate.

Moreover, excessive hydrogen (including water and a hydroxyl group) in the gate insulating layer 402 can also be removed by the first heat treatment.

The heat treatment may be performed, for example, in such a manner that an object to be processed is introduced into an electric furnace in which a resistance heating element or the like is used and heated in a nitrogen atmosphere at 450° C. for an hour. During the heat treatment, the oxide semiconductor layer is not exposed to the air to prevent the entry of water and hydrogen.

Note that a heat treatment apparatus is not limited to an electric furnace, and may include a device for heating an object to be processed by heat conduction or heat radiation from a medium such as a heated gas. For example, a rapid thermal anneal (RTA) apparatus such as a lamp rapid thermal anneal (LRTA) apparatus or a gas rapid thermal anneal (GRTA) apparatus can be used. An LRTA apparatus is an apparatus for heating an object to be processed by radiation of light (electromagnetic waves) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high temperature gas. As the high temperature gas, used is an inert gas which does not react with an object to be processed in heat treatment, such as nitrogen or a rare gas like argon.

For example, as the first heat treatment, GRTA treatment may be performed as follows. The object is put in an inert gas atmosphere that has been heated, heated for several minutes, and then taken out of the inert gas atmosphere. GRTA treatment enables high-temperature heat treatment in a short time. Moreover, GRTA treatment can be employed even when the temperature exceeds the upper temperature limit of the object. Note that the inert gas may be switched to a gas containing oxygen during the treatment. This is because defect levels in an energy gap due to oxygen vacancy can be reduced by performing the first heat treatment in an atmosphere containing oxygen.

Note that as the inert gas atmosphere, an atmosphere that contains nitrogen or a rare gas (e.g., helium, neon, or argon) as its main constituent and does not contain water, hydrogen, and the like is desirably used. For example, the purity of nitrogen or a rare gas such as helium, neon, or argon introduced into a heat treatment apparatus is 6N (99.9999%) or higher, preferably 7N (99.99999%) or higher (that is, the impurity concentration is 1 ppm or lower, preferably 0.1 ppm or lower).

In any case, the i-type (intrinsic) or substantially i-type oxide semiconductor layer in which impurities are reduced by the first heat treatment is formed, whereby a transistor having extremely excellent characteristics can be realized.

The above heat treatment (first heat treatment) can be referred to as dehydration treatment, dehydrogenation treatment, or the like because of its advantageous effect of removing hydrogen, water, and the like. The dehydration treatment or dehydrogenation treatment may be performed at the timing, for example, after the oxide semiconductor film is processed to have an island shape. Such dehydration treatment or dehydrogenation treatment may be conducted once or plural times.

Note that the case is described here in which after the oxide semiconductor film is processed to have an island shape, the first heat treatment is performed; however, one embodiment of the disclosed invention is not construed as being limited thereto. The oxide semiconductor film may be processed after the first heat treatment.

Figure 2C:
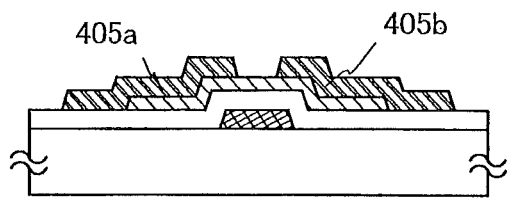

Next, a conductive film to be the source electrode and the drain electrode (including a wiring formed in the same layer as the source electrode and the drain electrode) is formed over the oxide semiconductor layer 403 by a sputtering method or the like and processed to form the source electrode 405a and the drain electrode 405b (see FIG. 2C).

An etching step may be performed with the use of a resist mask formed using a so-called multi-tone mask. A resist mask formed using a multi-tone mask has a plurality of thicknesses and can be further changed in shape by ashing; thus, such a resist mask can be used in a plurality of etching steps for different patterns. Therefore, a resist mask corresponding to at least two kinds of different patterns can be formed by using a multi-tone mask. In other words, the manufacturing process can be simplified.

Note that in etching of the conductive film, part of the oxide semiconductor layer 403 is etched, so that the oxide semiconductor layer having a groove (a recessed portion) is formed in some cases.

After that, by plasma treatment using a gas such as $N_2O$, $N_2$, or Ar, water or the like adsorbed to a surface of an exposed portion of the oxide semiconductor layer may be removed. In the case where plasma treatment is performed, the insulating film 407 in contact with part of the oxide semiconductor layer 403 is desirably formed following the plasma treatment without exposure to the air.

As the insulating film 407, an inorganic insulating film such as a gallium oxide film, a silicon oxide film, a silicon oxynitride film, an aluminum oxide film, or an aluminum oxynitride film can be typically used. In this embodiment, a gallium oxide film is used as the insulating film 407. When a gallium oxide film is used as the insulating film 407 and is made in contact with the oxide semiconductor layer, it is possible to sufficiently suppress trapping of charge at the interface between the insulating film 407 and the oxide semiconductor layer.

After the insulating film 407 is formed or after the source electrode 405a and the drain electrode 405b are formed, second heat treatment is desirably performed. The second heat treatment is performed at higher than or equal to 250° C. and lower than or equal to 700° C., preferably higher than or equal to 450° C. and lower than or equal to 600° C. or lower than a strain point of the substrate.

The second heat treatment may be performed in an atmosphere of nitrogen, oxygen, ultra-dry air (air in which a water content is 20 ppm or less, preferably 1 ppm or less, more preferably 10 ppb or less), or a rare gas (argon, helium, or the like). Note that it is preferable that water, hydrogen, and the like be not contained in the atmosphere of nitrogen, oxygen, ultra-dry air, a rare gas, or the like. It is also preferable that the purity of nitrogen, oxygen, or the rare gas which is introduced into a heat treatment apparatus be set to be 6N or higher, preferably 7N or higher (that is, the impurity concentration is 1 ppm or lower, preferably 0.1 ppm or lower).

In the second heat treatment, heating is performed in a state where the oxide semiconductor layer 403 and the insulating film 407 are in contact with each other and the gate insulating layer 402 and the oxide semiconductor layer 403 are in contact with each other. Thus, oxygen which is one of the main constituents of the oxide semiconductor and may be reduced due to the dehydration (or dehydrogenation) treatment can be moved from both the insulating film 407 and the gate insulating layer 402 to the oxide semiconductor layer. Consequently, a charge trapping center in the oxide semiconductor layer can be reduced.

Further, by the second heat treatment, impurities in the gate insulating layer 402 or the insulating film 407 can be removed at the same time, so that the purity of the gate insulating layer 402 or the insulating film 407 can be increased.

As described above, at least one of the first heat treatment and the second heat treatment is applied, whereby the oxide semiconductor layer 403 can be highly purified so as to contain impurities other than main components of the oxide semiconductor layer 403 as little as possible. The highly-purified oxide semiconductor layer 403 contains extremely few (close to zero) carriers derived from a donor, and the carrier concentration thereof is lower than $1\times10^{14}/cm^3$, preferably lower than $1\times10^{12}/cm^3$, more preferably lower than $1\times10^{11}/cm^3$.

Figure 2D:
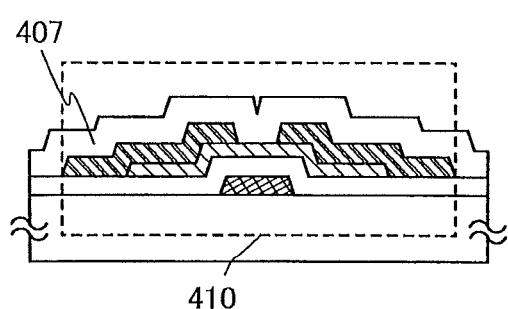
Figure 2E:
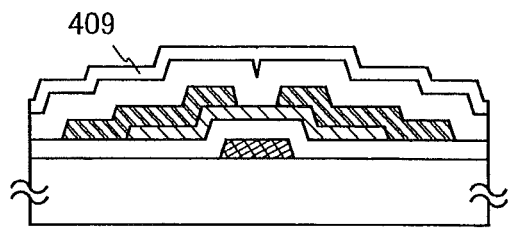

Through the above-described process, the transistor 410 in FIG. 2D is formed. Further, the protective insulating layer 409 may be formed over the insulating film 407, if needed. Note that there is no particular limitation on the timing of the second heat treatment as long as it is after the formation of the oxide semiconductor film 530. For example, the second heat treatment may be performed after the formation of the protective insulating layer 409. Alternatively, the second heat treatment may be performed following the first heat treatment, the first heat treatment may also serve as the second heat treatment, or the second heat treatment may also serve as the first heat treatment.

In the transistor according to this embodiment, a gallium oxide film containing a constituent similar to that of the oxide semiconductor layer, i.e., gallium is provided on the top surface and the bottom surface of an oxide semiconductor layer. A structure in which, as described above, a metal oxide film including a material compatible to (i.e., a material which does not give/receive an adverse affect to/from) an oxide semiconductor layer is provided in contact with the oxide semiconductor layer, is preferable in making electrical characteristics of a transistor stable.

The oxide semiconductor layer used for the active layer of the transistor is an oxide semiconductor layer highly purified to be electrically i-type (intrinsic) by removing impurities such as hydrogen, moisture, a hydroxyl group, and hydride (also referred to as a hydrogen compound) from the oxide semiconductor by heat treatment and supplying oxygen which is a major constituent of the oxide semiconductor and is simultaneously reduced in a step of removing impurities. The transistor including the oxide semiconductor layer highly purified in such a manner has electric characteristics which are less likely to vary, and thus is electrically stable.

As described above, a semiconductor device including an oxide semiconductor layer with stable electric characteristics can be provided. Therefore, a semiconductor device with high reliability can be provided.

Embodiment 2

Next, an example of a manufacturing process of the transistor 440 illustrated in FIG. 1C is described with reference to FIGS. 3A to 3E.

Figure 3A:
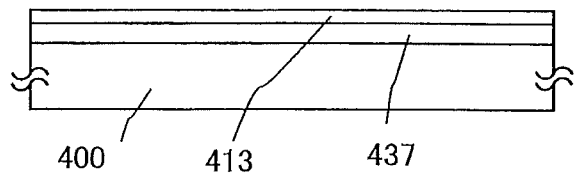
FIGS. 3A to 3E are cross-sectional process views illustrating one embodiment of the present invention.

First, the insulating film 437 is formed over the substrate 400, and an oxide semiconductor film 413 is formed on and in contact with the insulating film 437 (see FIG. 3A).

The oxide semiconductor film 413 is processed by being etched after a mask having a desired shape is formed over the oxide semiconductor film 413, so that the oxide semiconductor layer can be formed. The mask may be formed by a method such as photolithography or an ink-jet method.

Figure 3B:
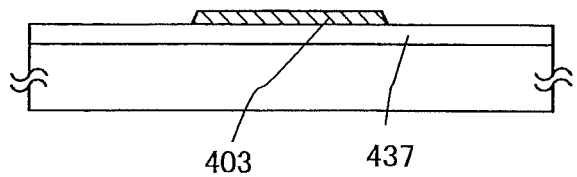
Figure 3C:
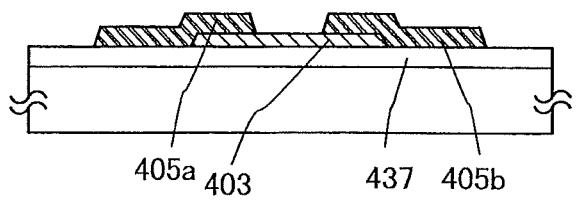
Figure 3D:
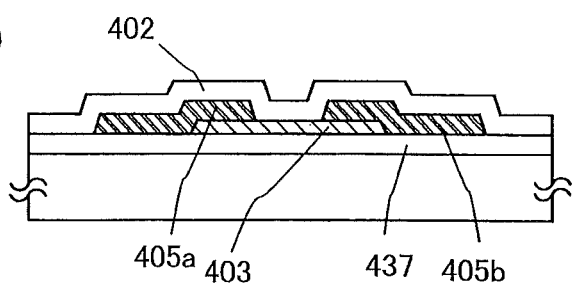
Figure 3E:
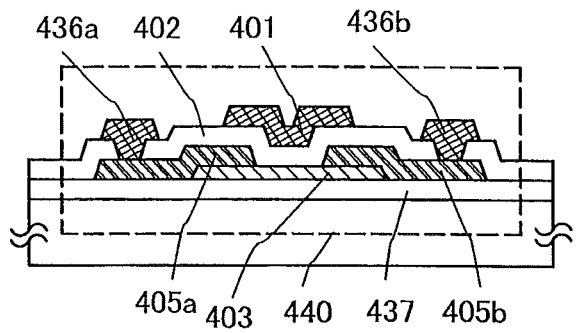

After that, heat treatment (first heat treatment) is desirably performed on the oxide semiconductor layer. Excessive hydrogen (including water and a hydroxyl group) in the oxide semiconductor layer is removed by the first heat treatment and the structure of the oxide semiconductor layer is modified, so that defect levels in an energy gap can be reduced. The first heat treatment is performed at higher than or equal to 250° C. and lower than or equal to 650° C., preferably higher than or equal to 450° C. and lower than or equal to 600° C. or lower than the strain point of the substrate. As shown in FIG. 3B, the oxide semiconductor layer 403 in which hydrogen is sufficiently reduced by the first heat treatment is obtained. The conditions of the first heat treatment are the same as the conditions of the first heat treatment described in Embodiment 1; therefore, the detailed description thereof is omitted here.

Next, a conductive film to be a source electrode and a drain electrode (including a wiring formed in the same layer as the source electrode and the drain electrode) is formed over the oxide semiconductor layer 403. The conductive film is processed, so that the source electrode 405a and the drain electrode 405b are formed (see FIG. 3C). Note that the channel length L of the transistor is determined by a distance between an end portion of the source electrode 405a and an end portion of the drain electrode 405b.

As a conductive film used for the source electrode 405a and the drain electrode 405b, for example, a metal film containing an element selected from Al, Cr, Cu, Ta, Ti, Mo, and W or a metal nitride film containing any of the above elements as its main component (a titanium nitride film, a molybdenum nitride film, or a tungsten nitride film) can be used. Alternatively, a film of a high-melting-point metal such as Ti, Mo, or W or a metal nitride film of any of these elements (e.g., a titanium nitride film, a molybdenum nitride film, or a tungsten nitride film) may be stacked on one of or both a bottom side and a top side of a metal film of Al, Cu, or the like.

The conductive film may be processed by etching with the use of a resist mask. Ultraviolet, a KrF laser light, an ArF laser light, or the like is preferably used for light exposure for forming a resist mask for the etching.

In the case where the channel length L is less than 25 nm, the light exposure at the time of forming the resist mask is preferably performed using, for example, extreme ultraviolet having an extremely short wavelength of several nanometers to several tens of nanometers. In the light exposure by extreme ultraviolet, the resolution is high and the focus depth is large. Thus, the channel length L of the transistor formed later can be reduced, whereby the operation speed of a circuit can be increased.

Note that in etching of the conductive film, part of the oxide semiconductor layer 403 is etched, so that the oxide semiconductor layer having a groove (a recessed portion) is formed in some cases.

After that, by plasma treatment using a gas such as $N_2O$, $N_2$, or Ar, water or the like adsorbed to a surface of an exposed portion of the oxide semiconductor layer may be removed. In the case where plasma treatment is performed, the gate insulating layer 402 in contact with part of the oxide semiconductor layer 403 is formed following the plasma treatment without exposure to the air (see FIG. 3D). In this embodiment, a gallium oxide film is used as the gate insulating layer 402.

After the gate insulating layer 402 is formed, second heat treatment is desirably performed. The second heat treatment is performed at higher than or equal to 250° C. and lower than or equal to 700° C., preferably higher than or equal to 450° C. and lower than or equal to 600° C. or lower than a strain point of the substrate. The conditions of the second heat treatment are the same as the conditions of the second heat treatment described in Embodiment 1; therefore, the detailed description thereof is omitted here.

At least one of the first heat treatment and the second heat treatment is applied, whereby the oxide semiconductor layer 403 can be highly purified so as to contain impurities other than main components of the oxide semiconductor layer 403 as little as possible. The highly-purified oxide semiconductor layer 403 contains extremely few (close to zero) carriers derived from a donor, and the carrier concentration thereof is lower than $1 \times 10^{14}/cm^3$, preferably lower than $1 \times 10^{12}/cm^3$, more preferably lower than $1 \times 10^{11}/cm^3$.

After that, the gate insulating layer 402 is selectively removed, so that a contact hole reaching the source electrode 405a or the drain electrode 405b is formed. Then, a conductive film is formed. The conductive film is processed, so that the gate electrode 401, the wiring layer 436a, and the wiring layer 436b are formed (see FIG. 3E). The gate electrode 401, the wiring layer 436a, and the wiring layer 436b can be formed to have a single-layer structure or a stacked structure using any of metal materials such as molybdenum, titanium, tantalum, tungsten, aluminum, copper, neodymium, and scandium, and an alloy material containing any of these materials as its main component.

Through the above-described process, the transistor 440 is formed.

Note that there is no particular limitation on the timing of the second heat treatment as long as it is after the formation of the oxide semiconductor film 413. For example, the second heat treatment may be performed after the formation of the gate electrode 401. Alternatively, the second heat treatment may be performed following the first heat treatment, the first heat treatment may also serve as the second heat treatment, or the second heat treatment may also serve as the first heat treatment.

Embodiment 3

In this embodiment, an example of a manufacturing process part of which is different from that described in Embodiment 2 is described below with reference to FIGS. 4A to 4E. The transistor of this embodiment is different from the transistor of Embodiment 2 in that an insulating film provided under an oxide semiconductor layer has a stacked structure and that the oxide semiconductor layer is formed over a source electrode and a drain electrode.

Figure 4A:
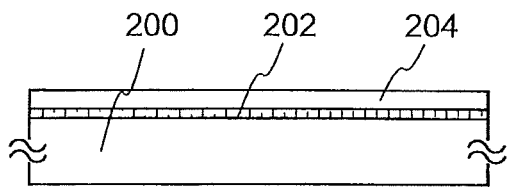
FIGS. 4A to 4E are cross-sectional process views illustrating one embodiment of the present invention.
Figure 4B:
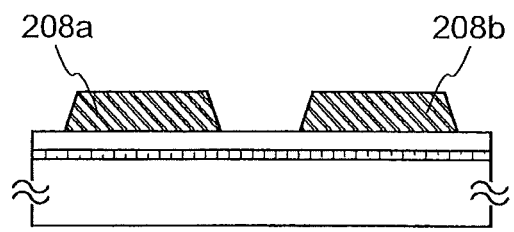
Figure 4C:
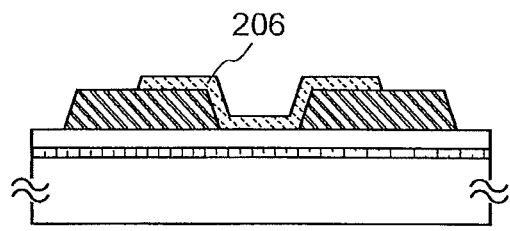

First, an insulating film 202 is formed over a substrate 200, and a metal oxide film 204 is formed on and in contact with the insulating film 202 (see FIG. 4A). As the insulating film 202, an inorganic insulating film such as a silicon oxide film, a silicon oxynitride film, an aluminum oxide film, or an aluminum oxynitride film can be typically used. The metal oxide film 204 is formed using a gallium oxide film.

Next, a conductive film to be a source electrode and a drain electrode (including a wiring formed in the same layer as the source electrode and the drain electrode) is formed over the metal oxide film 204. The conductive film is processed, so that a source electrode 208a and a drain electrode 208b are formed (see FIG. 4B). For the detail thereof, the description of the manufacturing process of the transistor 440 can be referred to.

Then, an oxide semiconductor film which is on and in contact with the metal oxide film 204 and is connected to the source electrode 208a and the drain electrode 208b is formed. The oxide semiconductor film is processed, so that an island-like oxide semiconductor layer 206 is formed (see FIG. 4C). For the detail thereof, the description of the manufacturing process of the transistor 440 can be referred to.

Figure 4D:
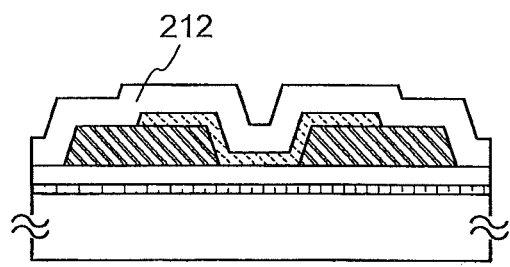

Then, a gate insulating layer 212 is formed so as to cover the source electrode 208a and the drain electrode 208b and be in contact with part of the oxide semiconductor layer 206 (see FIG. 4D). For the detail thereof, the description of the manufacturing process of the transistor 440 can be referred to.

Figure 4E:
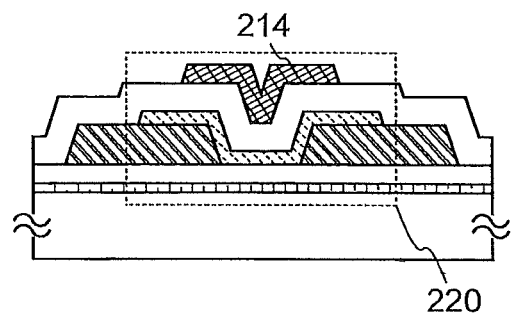

Then, a gate electrode 214 is formed (see FIG. 4E). For the detail thereof, the description of the manufacturing process of the transistor 440 can be referred to.

Through the above-described process, the transistor 220 is formed.

In the transistor according to this embodiment, a gallium oxide film containing a constituent similar to that of the oxide semiconductor layer is provided on the top surface and the bottom surface of an oxide semiconductor layer. The metal oxide film containing a material compatible with the oxide semiconductor layer is provided in contact with the oxide semiconductor layer as described above, whereby suppressed is trapping of charge or the like which can be generated due to the operation of a semiconductor device or the like, at the interface between the oxide semiconductor layer and the metal oxide film.

As described above, a semiconductor device including an oxide semiconductor, which has stable electric characteristics, can be provided. Therefore, a semiconductor device with high reliability can be provided.

The structures, methods, and the like described in this embodiment can be combined as appropriate with any of the structures, methods, and the like described in the other embodiments.

Embodiment 4

A semiconductor device having a display function (also referred to as a display device) can be manufactured using the transistor described in Embodiment 1 or Embodiment 3. Moreover, some or all of the driver circuits which include the transistor can be formed over a substrate where the pixel portion is formed, whereby a system-on-panel can be obtained.

Figure 5A:
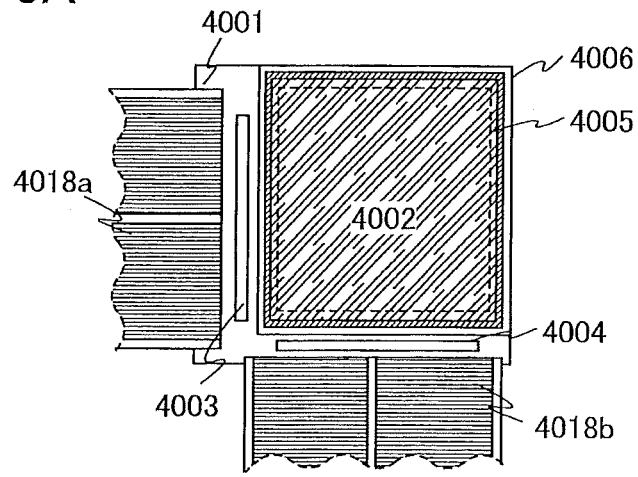
FIGS. 5A to 5C each illustrate one embodiment of a semiconductor device.

In FIG. 5A, a sealant 4005 is provided so as to surround a pixel portion 4002 provided over a first substrate 4001, and the pixel portion 4002 is sealed between the first substrate 4001 and the second substrate 4006. In FIG. 5A, a signal line driver circuit 4003 and a scan line driver circuit 4004 which are formed using a single crystal semiconductor film or a polycrystalline semiconductor film over a substrate separately prepared are mounted in a region that is different from the region surrounded by the sealant 4005 over the first substrate 4001. Various signals and potential are supplied to the signal line driver circuit 4003 and the scan line driver circuit 4004 each of which is separately formed, and the pixel portion 4002 from flexible printed circuits (FPCs) 4018a and 4018b.

Figure 5B:
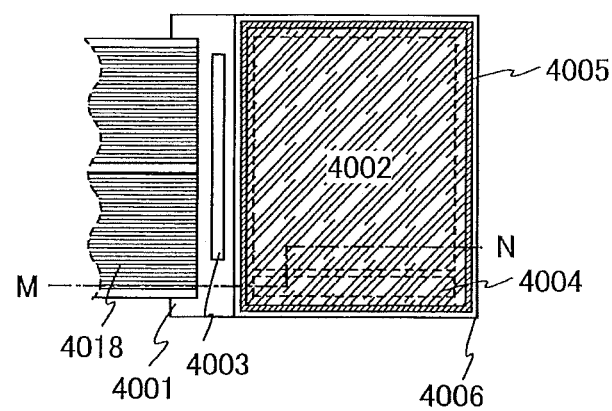
Figure 5C:
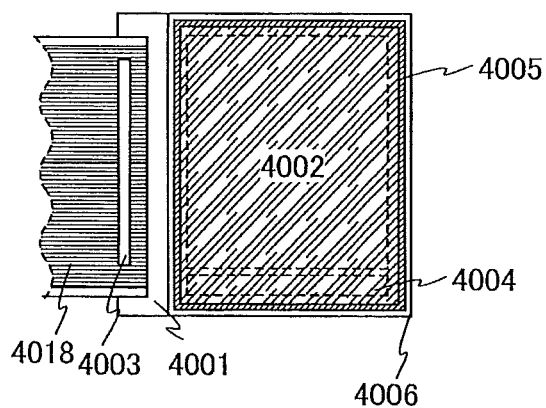

In FIGS. 5B and 5C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 5B and 5C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 5B and 5C, various signals and potential are supplied to the signal line driver circuit 4003 which is separately formed, the scan line driver circuit 4004, and the pixel portion 4002 from an FPC 4018.

Although FIGS. 5B and 5C each illustrate the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 5A illustrates an example in which the signal line driver circuit 4003 and the scan line driver circuit 4004 are mounted by a COG method. FIG. 5B illustrates an example in which the signal line driver circuit 4003 is mounted by a COG method. FIG. 5C illustrates an example in which the signal line driver circuit 4003 is mounted by a TAB method.

The display device includes in its category a panel in which a display element is sealed, and a module in which an IC such as a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in Embodiment 1 or Embodiment 3 can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 6:
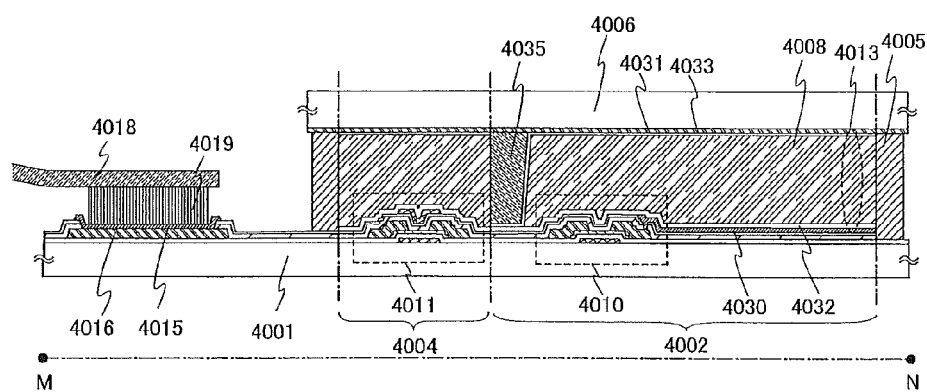
FIG. 6 illustrates one embodiment of a semiconductor device.
Figure 7:
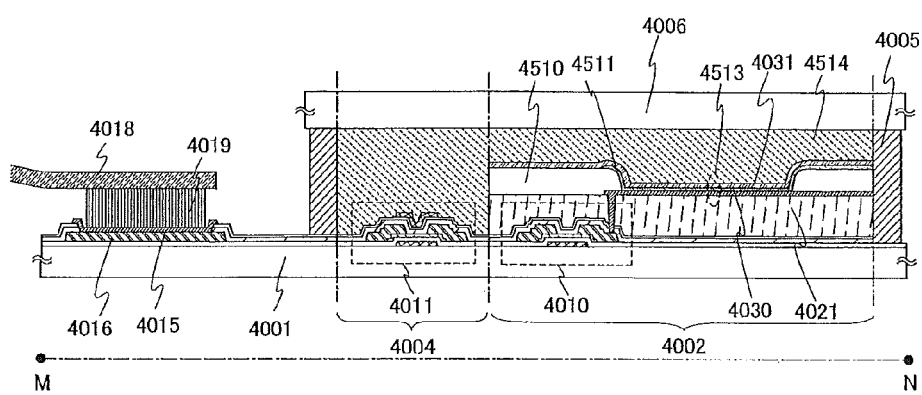
FIG. 7 illustrates one embodiment of a semiconductor device.
Figure 8:
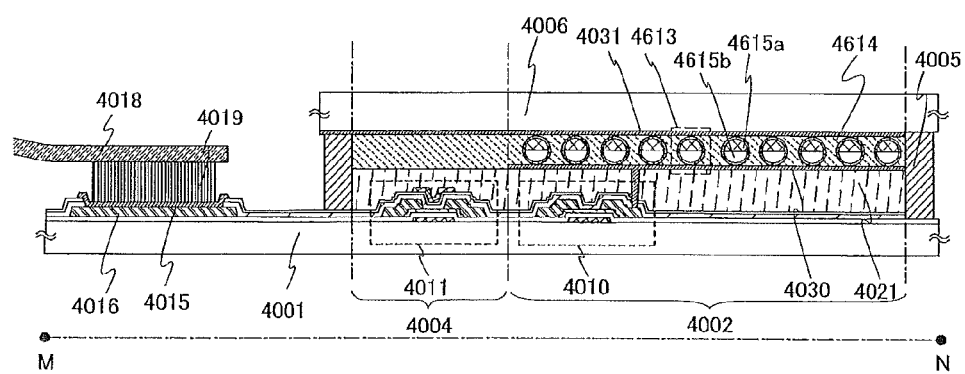
FIG. 8 illustrates one embodiment of a semiconductor device.

One embodiment of the semiconductor device is described with reference to FIG. 6, FIG. 7, and FIG. 8. FIG. 6, FIG. 7, and FIG. 8 correspond to cross-sectional views along line M-N in FIG. 5B.

As shown in FIG. 6, FIG. 7, and FIG. 8, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrodes of transistors 4010 and 4011.

Each of the pixel portion 4002 and the scan line driver circuit 4004 which are provided over the first substrate 4001 includes a plurality of transistors. In FIG. 6, FIG. 7, and FIG. 8, the transistor 4010 included in the pixel portion 4002 and the transistor 4011 included in the scan line driver circuit 4004 are illustrated as an example.

In this embodiment, any of the transistors shown in Embodiment 1 can be applied to the transistors 4010 and 4011. Variation in the electric characteristics of the transistors 4010 and 4011 is suppressed and the transistors 4010 and 4011 are electrically stable. As described above, a semiconductor device with high reliability as the semiconductor devices shown in FIG. 6, FIG. 7, and FIG. 8 can be obtained.

The transistor 4010 included in the pixel portion 4002 is electrically connected to a display element to form a display panel. A variety of display elements can be used as the display element as long as display can be performed.

An example of a liquid crystal display device using a liquid crystal element as a display element is described in FIG. 6. In FIG. 6, a liquid crystal element 4013 which is a display element includes the first electrode layer 4030, the second electrode layer 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A columnar spacer denoted by reference numeral 4035 is obtained by selective etching of an insulating film and is provided in order to control the thickness (a cell gap) of the liquid crystal layer 4008. Alternatively, a spherical spacer may also be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material shows a cholesteric phase, a smectic phase, a cubic phase, a chiral nematic phase, an isotropic phase, or the like depending on conditions.

Alternatively, a liquid crystal showing a blue phase for which an alignment film is unnecessary may be used. A blue phase is one of liquid crystal phases, which is generated just before a cholesteric phase changes into an, isotropic phase while temperature of a cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is higher than or equal to $1 \times 10^9$ Ω·cm, preferably higher than or equal to $1 \times 10^{11}$ Ω·cm, more preferably higher than or equal to $1 \times 10^{12}$ Ω·cm. The value of the specific resistivity in this specification is measured at 20° C.

The size of a storage capacitor formed in the liquid crystal display device is set considering the leakage current of the transistor provided in the pixel portion or the like so that charge can be held for a predetermined period.

The field-effect mobility of the transistor including a highly-purified oxide semiconductor layer used in this embodiment can be relatively high, whereby high-speed operation is possible. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as a vertical alignment mode. For example, an MVA (multi-domain vertical alignment) mode, a PVA (patterned vertical alignment) mode, an ASV mode, or the like can be employed. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. In particular, blocking light by a black matrix for preventing the oxide semiconductor layer of the transistor from being irradiated with light is important in improving reliability. For example, circular polarization may be obtained by using a polarizing substrate and a retardation substrate. In addition, a backlight, a side light, or the like may be used as a light source.

In addition, with the use of a plurality of light-emitting diodes (LEDs) as a backlight, a time-division display method (a field-sequential driving method) can be employed. With the field-sequential driving method, color display can be performed without using a color filter.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. The present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

FIG. 7 illustrates an example of a light-emitting device in which a light-emitting element is used as a display element. A light-emitting element 4513 which is a display element is electrically connected to the transistor 4010 provided in the pixel portion 4002. A structure of the light-emitting element 4513 is not limited to the stacked structure including the first electrode layer 4030, an electroluminescent layer 4511, and the second electrode layer 4031, which is illustrated in FIG. 7. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon, and polyvinyl chloride (PVC), acrylic, polyimide, an epoxy resin, a silicone resin, polyvinyl butyral (PVB), ethylene vinyl acetate (EVA), or the like can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 8 illustrates an active matrix electronic paper as one embodiment of a semiconductor device. The electronic paper in FIG. 8 is an example of a display device using a twisting ball display system. The twisting ball display method refers to a method in which spherical particles each colored in black and white are arranged between electrode layers included in a display element, and a potential difference is generated between the electrode layers to control the orientation of the spherical particles, so that display is performed.

Between the first electrode layer 4030 connected to the transistor 4010 and the second electrode layer 4031 provided on the second substrate 4006, spherical particles 4613 each of which includes a black region 4615a and a white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

In FIG. 6, FIG. 7, and FIG. 8, as the first substrate 4001 and the second substrate 4006, flexible substrates, for example, plastic substrates having a light-transmitting property or the like can be used, as well as glass substrates. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating layer 4021 can be formed using an inorganic insulating material or an organic insulating material. Note that an organic insulating material having heat resistance, such as an acrylic resin, a polyimide, a benzocyclobutene-based resin, a polyamide, or an epoxy resin is preferably used as a planarizing insulating film. Other than such organic insulating materials, it is possible to use a low-dielectric constant material (a low-k material), a siloxane based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021, and the insulating layer 4021 can be formed, depending on the material, by sputtering, spin coating, dipping, spray coating, droplet discharging (e.g., ink-jet, screen printing, or offset printing), roll coating, curtain coating, knife coating, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 4030 and the second electrode layer 4031 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition containing a conductive high molecule (also referred to as a conductive polymer) can be used for the first electrode layer 4030 and the second electrode layer 4031. As the conductive high molecule, a so-called π-electron conjugated conductive high molecule can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

Since the transistor is easily broken owing to static electricity or the like, a protective circuit for protecting the driver circuit is preferably provided. The protection circuit is preferably formed using a nonlinear element.

As described above, by using any of the transistors shown in Embodiment 1, a semiconductor device with high reliability can be provided. Note that the transistors described in Embodiment 1 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

The structures, methods, and the like described in this embodiment can be combined as appropriate with any of the structures, methods, and the like described in the other embodiments.

Embodiment 5

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the liquid crystal display device described in the above embodiment are described.

Figure 9A:
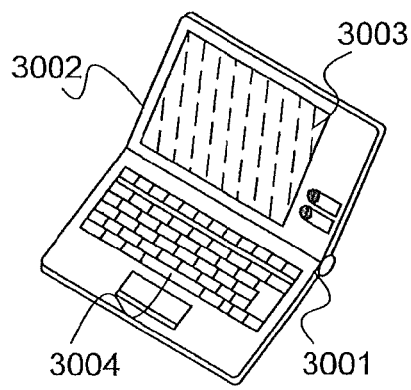
FIGS. 9A to 9F illustrate electronic devices.

FIG. 9A is a laptop personal computer, which includes a main body 3001, a housing 3002, a display portion 3003, a keyboard 3004, and the like. By employing the semiconductor device described in Embodiment 1 or Embodiment 3, the laptop personal computer can have high reliability.

Figure 9B:
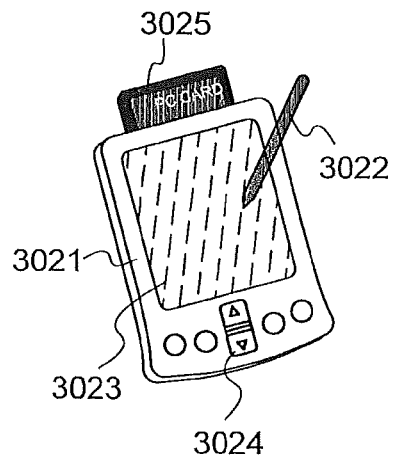

FIG. 9B is a portable information terminal (PDA), which includes a display portion 3023, an external interface 3025, an operation button 3024, and the like in a main body 3021. A stylus 3022 is included as an accessory for operation. By employing the semiconductor device described in Embodiment 1 or Embodiment 3, the portable information terminal (PDA) can have high reliability.

Figure 9C:
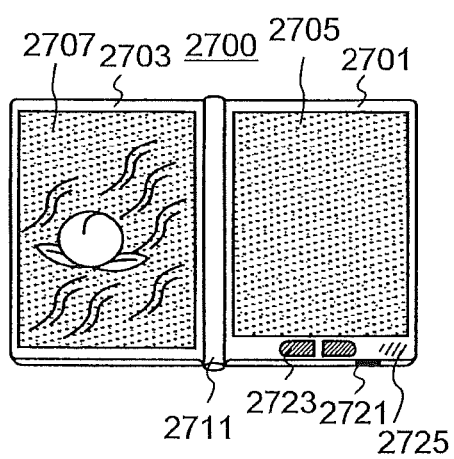

FIG. 9C illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 9C) can display text and a display portion on the left side (the display portion 2707 in FIG. 9C) can display graphics. By employing the semiconductor device described in Embodiment 1 or Embodiment 3, the e-book reader 2700 can have high reliability.

Further, FIG. 9C illustrates an example in which the housing 2701 is provided with an operation portion and the like. For example, the housing 2701 is provided with a power switch 2721, operation keys 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Figure 9D:
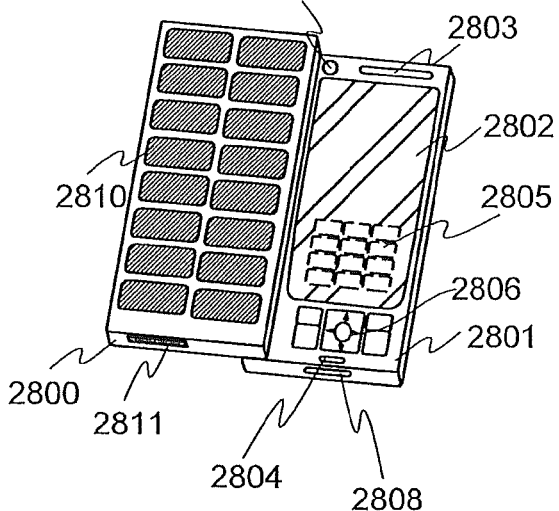

FIG. 9D is a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801. By employing the semiconductor device described in Embodiment 1 or Embodiment 3, the mobile phone can have high reliability.

Further, the display panel 2802 is provided with a touch panel. A plurality of operation keys 2805 that is displayed as images is illustrated by dashed lines in FIG. 9D. Note that a boosting circuit by which a voltage output from the solar cell 2810 is increased to be sufficiently high for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Further, the housings 2800 and 2801 in a state where they are developed as illustrated in FIG. 9D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 9E:
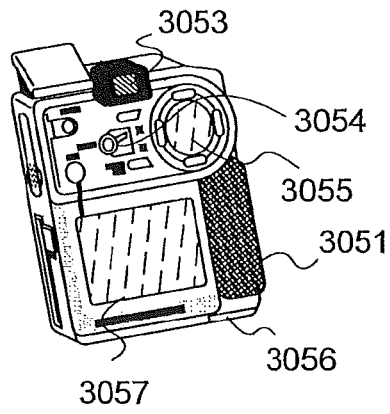

FIG. 9E illustrates a digital video camera which includes a main body 3051, a display portion A 3057, an eyepiece 3053, an operation switch 3054, a display portion B 3055, a battery 3056, and the like. By employing the semiconductor device described in Embodiment 1 or Embodiment 3, the digital video camera can have high reliability.

Figure 9F:
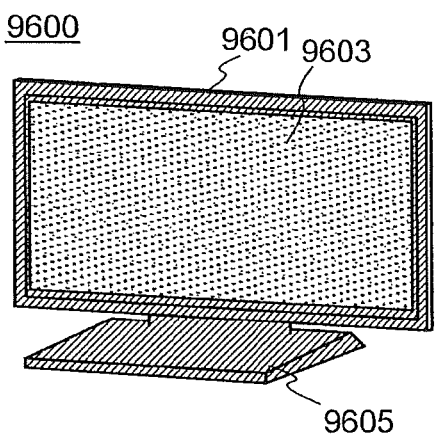

FIG. 9F illustrates an example of a television set. In a television set 9600, a display portion 9603 is incorporated in a housing 9601. The display portion 9603 can display images. Here, the housing 9601 is supported by a stand 9605. By employing the semiconductor device described in Embodiment 1 or Embodiment 3, the television set 9600 can have high reliability.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

The structures, methods, and the like described in this embodiment can be combined as appropriate with any of the structures, methods, and the like described in the other embodiments.

This application is based on Japanese Patent Application serial no. 2010-090368 filed with Japan Patent Office on Apr. 9, 2010, the entire contents of which are hereby incorporated by reference.

What is claimed is:

1. A semiconductor device comprising:
a first gate electrode over a substrate;

a first metal oxide film comprising gallium oxide over the first gate electrode;
an oxide semiconductor layer comprising indium, gallium and zinc over the first metal oxide film;
a source electrode and a drain electrode over and electrically connected to the oxide semiconductor layer;
a second metal oxide film comprising gallium oxide over the oxide semiconductor layer, the source electrode, and the drain electrode; and
a second gate electrode over the second metal oxide film.

2. The semiconductor device according to claim 1, wherein the first metal oxide film and the second metal oxide film are each an insulating film.

3. The semiconductor device according to claim 1, wherein the second gate electrode does not overlap with the source electrode and the drain electrode.

4. The semiconductor device according to claim 1, wherein a carrier concentration of the oxide semiconductor layer is lower than $1\times10^{14}/cm^3$.

5. The semiconductor device according to claim 1, further comprising a first film comprising hafnium between the first gate electrode and the first metal oxide film and a second film comprising hafnium between the second metal oxide film and the second gate electrode.

6. The semiconductor device according to claim 5, wherein each of the first film and the second film is one selected from a hafnium oxide film, a hafnium silicate film, a hafnium oxynitride silicate film, and a hafnium aluminate film.

7. A semiconductor device comprising:
a first gate electrode over a substrate;
a first metal oxide film comprising gallium oxide over the first gate electrode;
an oxide semiconductor layer comprising indium, gallium and zinc over the first metal oxide film;
a source electrode and a drain electrode over and electrically connected to the oxide semiconductor layer;
a second metal oxide film comprising gallium oxide over the oxide semiconductor layer, the source electrode, and the drain electrode; and
a second gate electrode over the second metal oxide film,
wherein the first metal oxide film and the second metal oxide film are in contact with each other.

8. The semiconductor device according to claim 7, wherein the second metal oxide film is in contact with a top surface of the first metal oxide film.

9. The semiconductor device according to claim 7, wherein the first metal oxide film and the second metal oxide film are each an insulating film.

10. The semiconductor device according to claim 7, wherein the second gate electrode does not overlap with the source electrode and the drain electrode.

11. The semiconductor device according to claim 7, wherein a carrier concentration of the oxide semiconductor layer is lower than $1\times10^{14}/cm^3$.

12. The semiconductor device according to claim 7, further comprising a first film comprising hafnium between the first gate electrode and the first metal oxide film and a second film comprising hafnium between the second metal oxide film and the second gate electrode.

13. The semiconductor device according to claim 12, wherein each of the first film and the second film is one selected from a hafnium oxide film, a hafnium silicate film, a hafnium oxynitride silicate film, and a hafnium aluminate film.

14. A semiconductor device comprising:
a first gate electrode over a substrate;
a film comprising hafnium oxide over the first gate electrode;
a first metal oxide film comprising gallium oxide over the film comprising hafnium oxide;
an oxide semiconductor layer comprising indium, gallium and zinc over the first metal oxide film;
a source electrode and a drain electrode over and electrically connected to the oxide semiconductor layer;
a second metal oxide film comprising gallium oxide over the oxide semiconductor layer, the source electrode, and the drain electrode; and
a second gate electrode over the second metal oxide film.

15. The semiconductor device according to claim 14, wherein the first metal oxide film and the second metal oxide film are each an insulating film.

16. The semiconductor device according to claim 14, wherein the second gate electrode does not overlap with the source electrode and the drain electrode.

17. The semiconductor device according to claim 14, wherein a carrier concentration of the oxide semiconductor layer is lower than $1\times10^{14}/cm^3$.

18. The semiconductor device according to claim 14, further comprising a film comprising hafnium between the second metal oxide film and the second gate electrode.

19. The semiconductor device according to claim 18, wherein the film comprising hafnium is one selected from a hafnium oxide film, a hafnium silicate film, a hafnium oxynitride silicate film, and a hafnium aluminate film.

20. A semiconductor device comprising:
a first gate electrode over a substrate;
a first metal oxide film over the first gate electrode;
an oxide semiconductor layer over the first metal oxide film;
a source electrode and a drain electrode electrically connected to the oxide semiconductor layer;
a second metal oxide film over the oxide semiconductor layer; and
a second gate electrode over the second metal oxide film,
wherein the first metal oxide film and the second metal oxide film each comprises a film containing gallium.

21. The semiconductor device according to claim 20, wherein the first metal oxide film and the second metal oxide film are each an insulating film.

22. The semiconductor device according to claim 20, wherein the second gate electrode does not overlap with the source electrode and the drain electrode.

23. The semiconductor device according to claim 20, wherein a carrier concentration of the oxide semiconductor layer is lower than $1\times10^{14}/cm^3$.

24. The semiconductor device according to claim 20, further comprising a film comprising hafnium between the second metal oxide film and the second gate electrode.

25. The semiconductor device according to claim 24, wherein the film comprising hafnium is one selected from a hafnium oxide film, a hafnium silicate film, a hafnium oxynitride silicate film, and a hafnium aluminate film.

* * * * *